April 11, 1950 J. A. BURNOT 2,503,900
AUTOMATIC GAIN CONTROL SYSTEM
Filed Jan. 28, 1948
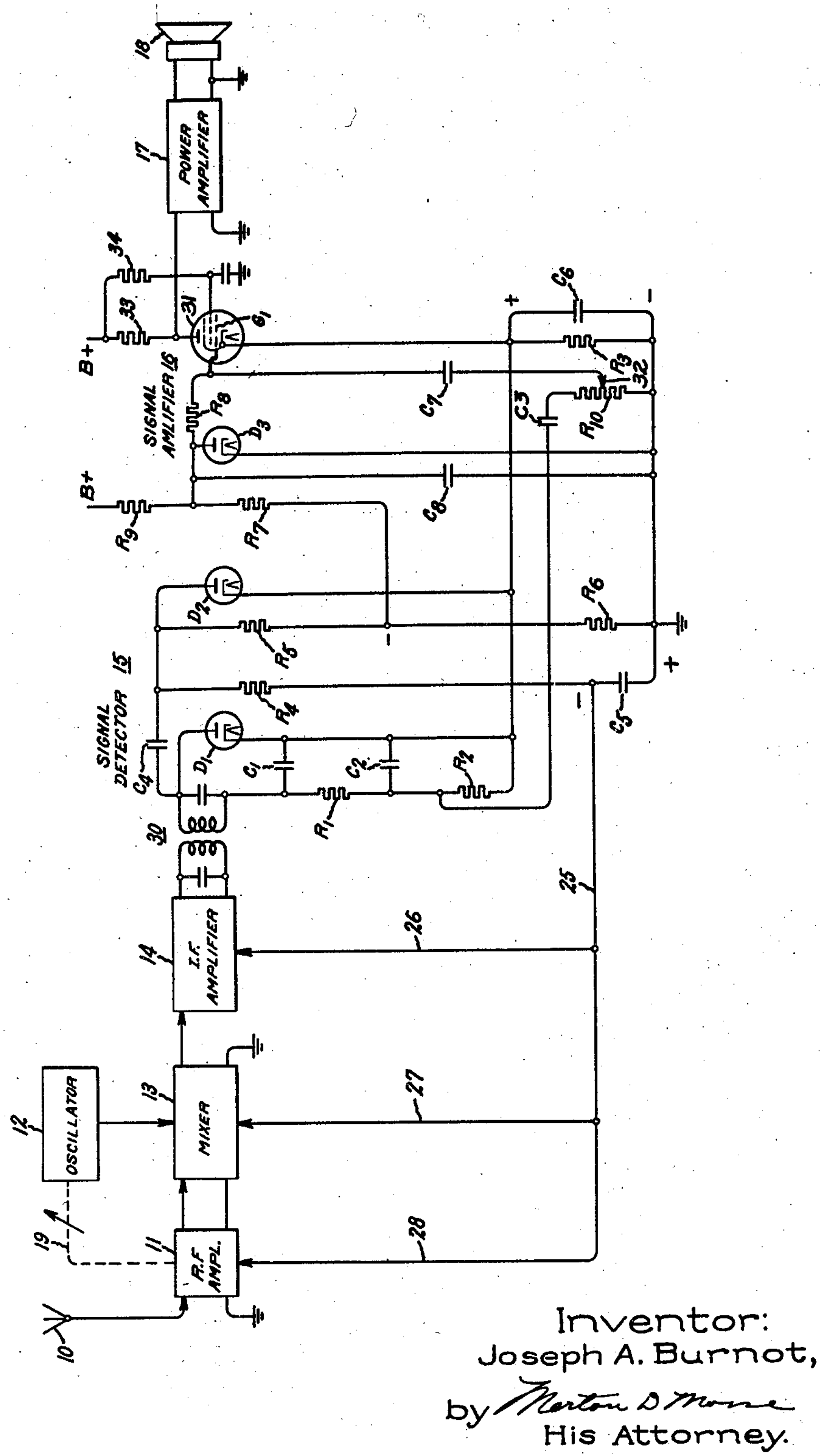
Inventor:
Joseph A. Burnot,
by Morton D. Moore
His Attorney.

Patented Apr. 11, 1950 2,503,900

UNITED STATES PATENT OFFICE 2,503,900

AUTOMATIC GAIN CONTROL SYSTEM

Joseph A. Burnot, Paris, France, assignor to General Electric Company, a corporation of New York Application January 28, 1948, Serial No. 4,750
In France December 29, 1943

Section 1, Public Law 690, August 8, 1946
Patent expires December 29, 1963

2 Claims. (Cl. 250—20)

My invention relates to an automatic gain control system and is particularly applicable to automatic gain control circuits of a radio receiver.

It is a principal object of my invention to provide an improved automatic gain control system which operates effectively over a very wide range of input signal voltages. Briefly, this is accomplished in accordance with the invention by deriving two independently adjustable, delayed automatic gain control potentials from the detected signals. The first of these potentials is developed when the amplitude of the detected signals exceeds a first threshold level and is utilized primarily to regulate the gain of preceding high frequency and intermediate frequency amplifier stages. The second of these potentials is developed only when the signal level exceeds a second, higher threshold value and is utilized to regulate the gain of a succeeding signal frequency amplifier stage.

It is a further object of my invention to provide an improved automatic gain control system for a radio receiver which combines a plurality of control actions in order to provide most effective operation over a very wide range of sgnal conditions.

Still another object of my invention is to provide an improved automatic gain control system for an amplitude-modulation signal receiving system which requires a minimum of circuit components and adjustments and yet provides a highly effective gain limiting action.

For additional objects and advantages, and for a better understanding of the invention, attention is now directed to the following description and accompanying drawing, and also to the appended claims in which the features of the invention believed to be novel are particularly pointed out.

The single figure of the drawing is a circuit diagram, partly in simplified schematic block form, of a superheterodyne radio receiver embodying the invention.

In the accompanying drawing, those elements which particularly relate to the automatic gain control circuits are represented in detail, while the remaining elements of the superheterodyne receiver are merely represented in block form since their details are not material to the invention and it is only necessary to indicate their relationship to the automatic gain control circuits. Amplitude-modulated carrier signals received by antenna 10 may be amplified in a radio frequency amplifier 11. They are then combined in the usual manner with locally-generated oscillations from oscillator 12 in mixer 13. The intermediate frequency carrier signals are then further amplified in intermediate frequency amplifier 14 and demodulated in detector 15, after which they are amplified in signal amplifier 16. They may then be further amplified in a power amplifier 17 before being supplied to a suitable translating device such as a loud speaker 18.

Those skilled in the art will recognize that the circuit elements just described are those of the conventional superheterodyne radio receiver and may be subject to considerable variations. Each of the amplifying units 11, 14, and 17 may comprise one or more stages. In some cases the radio frequency amplifier 11 may be omitted. Where it is used in a tunable system, it is unicontrolled with oscillator 12 for proper signal tracking, as indicated by dashed connections 19. One or several of the various stages preceding detector 15 may be supplied with automatic gain control potentials to regulate the gain thereof in the conventional manner, as indicated by connections 25, 26, 27, and 28. The manner in which these and other gain control potentials are developed in accordance with my invention will now be considered in greater detail.

Signal detector 15 is represented as a known form of diode detector circuit comprising an input transformer 30 coupled to the output of intermediate frequency amplifier 14, a diode $D_1$, and output load resistors $R_1$ and $R_2$ in series. Resistors $R_1$ and $R_2$ are by-passed for intermediate frequencies in the usual manner by capacitors $C_1$ and $C_2$. The cathode of diode $D_1$ is connected to ground through a resistor $R_3$ which is by-passed for signal frequencies (for example, audio frequencies) by capacitor $C_6$. Signal frequencies appearing across $R_2$ are supplied through blocking capacitor $C_3$ to potentiometer $R_{10}$.

Signal amplifier 16 is represented as comprising a pentode 31 having a control grid $G_1$ connected to a tap 32 on potentiometer $R_{10}$ through blocking capacitor $C_7$. The cathode is connected to ground through the resistor $R_3$ which, with bypass capacitor $C_6$ forms a self-bias cathode network. Anode and screen grid operating potentials are supplied in the conventional manner from any suitable source, represented conventionally by the symbol B+, through resistors 33 and 34, respectively. Control grid $G_1$ is also connected to ground for direct voltages through a resistance network comprising resistors $R_6$, $R_7$ and $R_8$ in series. Resistors $R_6$ and $R_7$ are also connected between B+ and ground through an additional resistor $R_9$, thus forming a voltage divider network, the function of which will be shortly apparent.

In accordance with my invention the intermediate frequency signals at the output of the transformer 30 are also supplied through coupling capacitor $C_4$ to a gain control detection circuit comprising a diode $D_2$ and load resistors $R_5$ and $R_6$. It will be observed that this load circuit also includes the cathode bias network $R_3$ and $C_6$. Network $R_3$, $C_6$ provides a threshold operating level, or delay bias for diode $D_2$ due to the flow of space current in pentode 31. It will be observed that flow of space current through resistor $R_3$ tends to render the cathode of diode $D_2$ positive with respect to ground and to maintain it non-conducting. When the input signal voltages are sufficient to render diode $D_2$ conducting, unidirectional gain control potentials are developed across resistors $R_5$ and $R_6$ and impressed on conductor 25 through a filter network comprising resistor $R_4$ and capacitor $C_5$. The potentials developed across capacitor $C_5$ are negative with respect to ground, as indicated, and are utilized to reduce the gain of one or more of the preceding amplifier stages, as previously indicated. The time constant of filter network $R_4$, $C_5$ is made relatively long, as is customary, in order to eliminate any low-frequency ripple.

Although the diodes $D_1$ and $D_2$ and the pentode 31 have been represented as separate tubes in order to clarify the disclosure, it will be apparent that they may all be conveniently combined in a single tube of the duplex-diode-pentode type since all their cathodes are connectd together.

A third diode $D_3$ is connected between the junction of resistors $R_7$, $R_8$, $R_9$ and ground. This diode is shunted by a capacitor $C_8$ and is arranged so as to be normally conducting in response to the positive potentials supplied from B+ through resistor $R_9$. Thus diode $D_3$ provides a low impedance path to complete a connection from grid $G_1$ to ground through resistor $R_8$, so long as it is conducting.

A fraction of the gain control voltage, appearing across resistor $R_6$ when diode $D_2$ is conducting, is impressed through the filter $R_7$, $C_8$ on diode $D_3$. It will be observed that the polarity is such as to oppose the positive bias voltage which normally maintains diode $D_3$ conductive.

The system operates as follows: When the amplitude of the signal voltage supplied to transformer 30 increases, starting from zero, no gain control action takes place so long as the signal level has not reached a definite threshold value determined by the voltage drop across resistor $R_3$. When the voltage exceeds this level and causes diode $D_2$ to conduct, automatic gain control potentials are impressed upon conductor 25 in the manner previously described. The circuit constants are arranged so that the voltage impressed upon diode $D_3$ through resistor $R_7$ is insufficient to overcome its positive bias until a second higher signal level is reached. Thus the diode $D_3$ remains conducting and the signal amplifier 16 continues to operate without substantial reduction in amplification until this second, higher threshold level is reached. Finally, when the detected signal voltage impressed upon diode $D_3$ becomes sufficient, the latter is rendered non-conducting and the regulating voltage is applied to the control grid of tube 31 as well as to the preceding receiver stages, reducing its gain as well.

By a suitable selection of the ratio between resistors $R_5$ and $R_6$, it is possible to obtain almost perfect regulation in this third operating range. In an apparatus built in accordance with the above description, a first operating threshold was obtained for an input voltage of about 50 microvolts, and the second threshold at about 1000 microvolts. There was no regulating effect in the first part of the regulation curve, that is to say, between about 10 and 50 microvolts. The regulating effect between about 50 and 1000 microvolts was such that the input level had to be varied by 4 decibels in order to obtain a variation in the output level amounting to 1 decibel. Finally, in the last operating zone, which lay between about 1000 microvolts and 1 volt, the slope of the gain control curve was such that it would have been necessary to vary the input level by about 80 decibels in order to obtain a variation in the output level amounting to 1 decibel. These figures are purely illustrative, but they serve to bring out the extremely desirable operating characteristics of the system embodying my invention.

It is, of course, evident that the automatic gain control circuits of my invention are applicable to other types of receiving apparatus as well as to a superheterodyne receiver, regardless of whether they are used for radio communication or other high frequency transmission.

While a specific embodiment has been shown and described, it will of course be understood that various modifications may be made without departing from the invention. The appended claims are therefore intended to cover any such modifications within the true spirit and scope of the invention.

What I claim as new and desire to secure by Letters Patent of the United States is:

1. The combination, in a receiving system of the type including a carrier wave amplifier, a detector for demodulating the amplified carrier waves and a signal amplifier to which the detected signals are supplied, said signal amplifier having a self-bias cathode impedance, of a control circuit including a rectifier and load impedance for developing gain control potentials on said load impedance in response to said carrier waves, means for impressing a delay bias on said circuit derived from said cathode impedance, whereby said potentials are developed only when said carrier waves exceed a first level dependent upon said self-bias, means for applying said potentials to said carrier wave amplifier in a sense to reduce the gain thereof, means for additionally impressing said potentials on said signal wave amplifier in a sense to reduce the gain thereof, and means comprising a second rectifier normally biased to conducting condition for preventing application of said potentials to said signal amplifier until they exceed a value corresponding to a second higher carrier level at which said second rectifier is cut off.

2. The combination, in a receiving system of the type including a carrier wave amplifier, a detector for demodulating the amplified carrier waves and a signal amplifier to which the detected signals are supplied, said signal amplifier having a self-bias cathode impedance, of a control circuit including a rectifier and load impedance for developing gain control potentials on said load impedance response to said carrier waves, means for impressing a delay bias on said circuit derived from said cathode impedance, whereby said potentials are developed only when said carrier waves exceed a first level dependent upon said self bias, means for applying said potentials to said carrier wave amplifier in a sense to reduce the gain thereof, means for additionally impressing gain control potentials developed across only a portion of said load impedance upon said signal amplifier in a sense tending to reduce the gain thereof, a second control circuit including a second rectifier connected in shunt relation to said portion, said second rectifier being poled to be rendered nonconductive by the potentials developed across said portion, and means for applying a predetermined positive bias potential to said second rectifier adjusted to maintain it conductive until said potentials across said portion exceed a value corresponding to a second, higher signal level, thereby to prevent application of said potentials to said signal amplifier until they exceed said second level.

JOSEPH A. BURNOT.

REFERENCES CITED

The following references are of record in the file of this patent:

UNITED STATES PATENTS

| Number | Name | Date |
|---|---|---|
| 2,013,121 | Wheeler | Sept. 3, 1935 |
| 2,076,814 | Franks | Apr. 13, 1937 |
| 2,117,664 | Holst | May 17, 1938 |
| 2,144,224 | Koch | Jan. 17, 1939 |
| 2,159,803 | Koltz | May 23, 1939 |
| 2,171,657 | Koltz | Sept. 5, 1939 |
| 2,207,094 | Getaz | July 9, 1940 |